(12) United States Patent
Khalili et al.

(10) Patent No.: US 9,553,545 B1
(45) Date of Patent: Jan. 24, 2017

(54) STABLE DIFFERENTIAL CRYSTAL OSCILLATOR WITH ACTIVE SUPER DIODES

(71) Applicant: QUALCOMM Incorporated, San Diego, CA (US)

(72) Inventors: Alireza Khalili, Sunnyvale, CA (US); Afshin Babveyh, Palo Alto, CA (US); Mazhareddin Taghivand, Campbell, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/983,180

(22) Filed: Dec. 29, 2015

(51) Int. Cl.
*H03B 5/36* (2006.01)

(52) U.S. Cl.
CPC .................................... *H03B 5/364* (2013.01)

(58) Field of Classification Search
CPC ..................................................... H03B 5/364
USPC ............ 331/73, 116 R, 116 FE, 116 M, 158
See application file for complete search history.

(56) References Cited

U.S. PATENT DOCUMENTS

| | | | |
|---|---|---|---|
| 6,690,242 B2* | 2/2004 | Fang ...................... | H03K 5/133 327/256 |
| 6,696,899 B2 | 2/2004 | Ruffieux | |
| 6,828,868 B2* | 12/2004 | Sano .................... | H03B 5/1265 331/116 R |
| 6,867,658 B1* | 3/2005 | Sibrai .................. | H03B 5/1215 331/117 FE |
| 7,679,465 B2 | 3/2010 | Aspemyr et al. | |
| 7,733,190 B2 | 6/2010 | Yajima et al. | |
| 9,071,194 B1 | 6/2015 | Djahanshahi et al. | |
| 2009/0128245 A1* | 5/2009 | Aspemyr ............. | H03B 5/1215 331/117 FE |
| 2016/0028349 A1* | 1/2016 | Rajavi ...................... | H03B 5/36 331/116 FE |

FOREIGN PATENT DOCUMENTS

KR 101073106 B1 10/2011

* cited by examiner

*Primary Examiner* — Richard Tan
(74) *Attorney, Agent, or Firm* — Paradice and Li LLP (57) ABSTRACT

Differential crystal oscillator circuits are disclosed that may provide low-power, low phase noise operation, and prevent latching at low frequency by providing a low impedance DC path using active super diodes.

19 Claims, 10 Drawing Sheets

STABLE DIFFERENTIAL CRYSTAL OSCILLATOR WITH ACTIVE SUPER DIODES

TECHNICAL FIELD

The example embodiments relate generally to crystal oscillators, and specifically to differential crystal oscillators.

BACKGROUND OF RELATED ART

Wireless devices may communicate with other devices using multiple technologies, including wireless local area network (WLAN) signals (e.g., 900 MHz, 2.4 GHz, 5 GHz, and 60 GHz signaling), BLUETOOTH® (BT or Bluetooth) signals, near field communication (NFC) signals, and cellular signals such as long term evolution (LTE) signals. For example, a wireless device may include a transmitter to transmit communication signals to other devices, and may include a receiver to receive communication signals from other devices.

Some transmitted communication signals may include one or more undesired signal components. These undesired signal components may include unwanted harmonics of clock signals. These unwanted harmonics, which are commonly referred to as frequency spurs, may degrade performance of the device.

Many wireless devices include crystal oscillators to generate clock signals. For example, a crystal oscillator may be used to generate a highly accurate reference clock signal that, in turn, may be used to generate radio-frequency (RF) signals such as carrier signals and local oscillator (LO) signals. Unwanted harmonics of the clock signal generated by the crystal oscillator may be coupled into other sensitive circuits and components of the wireless device, and may undesirably appear at outputs of the wireless device's transceiver.

Thus, it is desirable to reduce or eliminate these unwanted clock signal harmonics.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Apparatus are disclosed for differential crystal oscillator circuits. In one example, a differential crystal oscillator circuit is disclosed, and may include a crystal, coupled between a first terminal and a second terminal, to generate an oscillating signal. The differential crystal oscillator circuit may also include a first transistor, a second transistor, a first super diode, and a second super diode. The first transistor may include a drain coupled to the first terminal, a gate coupled to the second terminal, and a source coupled to a supply voltage. The second transistor may a drain coupled to the second terminal, a gate coupled to the first terminal, and a source coupled to the supply voltage. The first super diode may be coupled between the first terminal and the supply voltage, the first super diode including a first transconductance (Gm) amplifier coupled to a first diode-connected transistor. The second super diode may be coupled between the second terminal and the supply voltage, the second super diode including a second Gm amplifier coupled to a second diode-connected transistor.

In another example, a differential crystal oscillator circuit is disclosed that may include a crystal, coupled between a first terminal and a second terminal, to generate an oscillating signal. The differential crystal oscillator circuit may also include a first transistor, a second transistor, a first super diode, and a second super diode. The transistor may include a drain coupled to the first terminal, a gate coupled to the second terminal, and a source coupled to ground potential. The second transistor may include a drain coupled to the second terminal, a gate coupled to the first terminal, and a source coupled to ground potential. The first super diode may be coupled between the first terminal and ground potential, the first super diode including a first transconductance (Gm) amplifier coupled to a first diode-connected transistor. The second super diode may be coupled between the second terminal and ground potential, the second super diode including a second Gm amplifier coupled to a second diode-connected transistor.

In another example, a circuit to provide a clock signal is disclosed. The circuit may include a crystal, coupled between a first terminal and a second terminal, to generate an oscillating signal. The circuit may include a pair of cross-coupled transistors coupled to the crystal, and may include a pair of super diodes. Each of the pair of super diodes may be coupled to a respective one of the first and second terminals, may be configured to exhibit a negligible transconductance at an oscillation frequency of the oscillating signal, and may be configured to provide a direct-current (DC) path, between a first voltage and a respective one of the first and second terminals, for a range of frequencies that is less than the oscillation frequency of the oscillating signal.

BRIEF DESCRIPTION OF THE DRAWINGS

The example embodiments are illustrated by way of example and are not intended to be limited by the figures of the accompanying drawings.

Like reference numerals refer to corresponding parts throughout the drawing figures.

DETAILED DESCRIPTION

The example embodiments are described below in the context of a wireless device deployed in a WLAN system for simplicity only. It is to be understood that the example embodiments are equally applicable to devices deployed in other wireless systems or networks (e.g., cellular networks, pico networks, femto networks, satellite networks), as well as to devices deployed in wired systems or networks (e.g., Ethernet and/or HomePlug/PLC standards). As used herein, the terms "WLAN" and "Wi-Fi®" may include communications governed by the IEEE 802.11 family of standards, Bluetooth, HiperLAN (a set of wireless standards, comparable to the IEEE 802.11 standards, used primarily in Europe), and other technologies having relatively short radio propagation range. Thus, the terms "WLAN" and "Wi-Fi" may be used interchangeably herein. In addition, although described below in terms of an infrastructure WLAN system including one or more APs and a number of STAs, the example embodiments are equally applicable to other WLAN systems including, for example, multiple WLANs, peer-to-peer (or Independent Basic Service Set) systems, Wi-Fi Direct systems, and/or Hotspots. In addition, although described herein in terms of exchanging data frames between wireless devices, the example embodiments may be applied to the exchange of any data unit, packet, and/or frame between wireless devices. Thus, the term "frame" may include any frame, packet, or data unit such as, for example, protocol data units (PDUs), MAC protocol data units (MPDUs), and physical layer convergence procedure protocol data units (PPDUs). The term "A-MPDU" may refer to aggregated MPDUs.

The terminology used herein is for the purpose of describing particular aspects only and is not intended to be limiting of the aspects. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Also, in the following description and for purposes of explanation, specific nomenclature is set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. The example embodiments are not to be construed as limited to specific examples described herein but rather to include within their scopes all embodiments defined by the appended claims.

As mentioned above, many wireless devices include a crystal oscillator to generate clock signals. A differential crystal oscillator, which typically includes a cross-coupled pair of transistors as an active device, may be more immune to interference and frequency spurs than a single-ended crystal oscillator. Single-ended crystal oscillators typically include a low-impedance direct-current (DC) path that may prevent the oscillator from latching. Differential crystal oscillators typically lack such a low-impedance DC path that ensures continued oscillation, and instead may include high-pass filtering and/or source degeneration to avoid latching at relatively low frequencies. However, high-pass filtering and/or source degeneration may not only exhibit poor phase noise performance but may also consume significant power.

Thus, a differential crystal oscillator circuit is disclosed that may be more power-efficient and more stable than conventional differential crystal oscillator circuits. In accordance with example embodiments, differential crystal oscillator circuits disclosed herein may include a number of active super diodes to provide a low-impedance DC path at relatively low frequencies, for example, to prevent the oscillator circuit from latching at the relatively low frequencies. As used herein, the term "relatively low frequencies" may refer to a range of frequencies that is less than one or more desired oscillation frequencies. More specifically, for at least some embodiments, each of the active super diodes may include a transconductance (Gm) amplifier coupled between the source and gate terminals of a diode-connected transistor. The Gm amplifier may be configured to have a bandwidth limited to these relatively low frequencies, for example, so that the active super diodes may exhibit a relatively small impedance (e.g., a positive transconductance) for relatively low frequencies, and may exhibit a relatively large impedance (e.g., a negligible transconductance) for the desired oscillation frequencies. These and other details of the example embodiments, which provide one or more technical solutions to the aforementioned technical problems, are described in more detail below.

Figure 1:
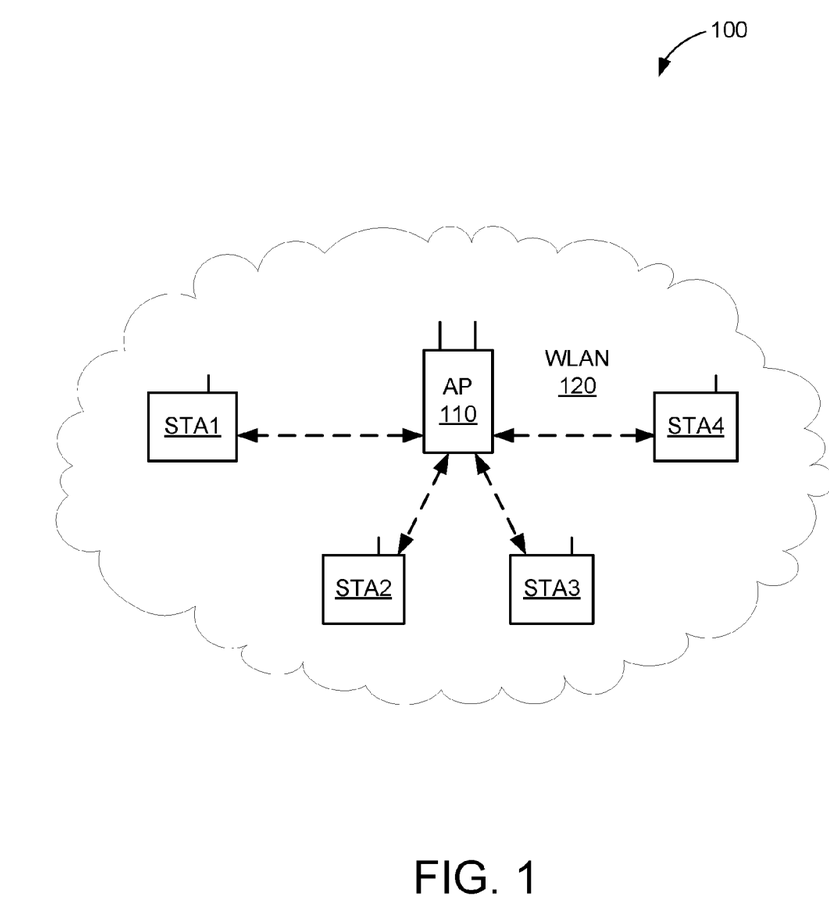
FIG. 1 shows a block diagram of a wireless system within which the example embodiments may be implemented.

FIG. 1 is a block diagram of a wireless system 100 within which the example embodiments may be implemented. The wireless system 100 is shown to include four wireless stations STA1-STA4, a wireless access point (AP) 110, and a wireless local area network (WLAN) 120. The WLAN 120 may be formed by a plurality of Wi-Fi access points (APs) that may operate according to the IEEE 802.11 family of standards (or according to other suitable wireless protocols). Thus, although only one AP 110 is shown in FIG. 1 for simplicity, it is to be understood that WLAN 120 may be formed by any number of access points such as AP 110. The AP 110 is assigned a unique media access control (MAC) address that is programmed therein by, for example, the manufacturer of the access point. Similarly, each of stations STA1-STA4 is also assigned a unique MAC address. For some embodiments, the wireless system 100 may correspond to a multiple-input multiple-output (MIMO) wireless network. Further, although the WLAN 120 is depicted in FIG. 1 as an infrastructure BSS, for other example embodiments, WLAN 120 may be an IBSS, an ad-hoc network, or a peer-to-peer (P2P) network (e.g., operating according to the Wi-Fi Direct protocols).

Each of stations STA1-STA4 may be any suitable Wi-Fi enabled wireless device including, for example, a cell phone, personal digital assistant (PDA), tablet device, laptop computer, or the like. Each of stations STA1-STA4 may also be referred to as a user equipment (UE), a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. For at least some embodiments, each of stations STA1-STA4 may include one or more transceivers, one or more processing resources (e.g., processors and/or ASICs), one or more memory resources, and a power source (e.g., a battery). The memory resources may include a non-transitory computer-readable medium (e.g., one or more nonvolatile memory elements, such as EPROM, EEPROM, Flash memory, a hard drive, etc.) that stores instructions to be executed by the one or more processing resources.

The AP 110 may be any suitable device that allows one or more wireless devices to connect to a network (e.g., a local area network (LAN), wide area network (WAN), metropolitan area network (MAN), and/or the Internet) via AP 110 using Wi-Fi, Bluetooth, or any other suitable wireless communication standards. For at least one embodiment, AP 110 may include one or more transceivers, one or more processing resources (e.g., processors and/or ASICs), one or more memory resources, and a power source. The memory resources may include a non-transitory computer-readable medium (e.g., one or more nonvolatile memory elements, such as EPROM, EEPROM, Flash memory, a hard drive, etc.) that stores instructions to be executed by the one or more processing resources.

For the stations STA1-STA4 and/or AP 110, the one or more transceivers may include Wi-Fi transceivers, Bluetooth transceivers, cellular transceivers, and/or other suitable radio frequency (RF) transceivers (not shown for simplicity) to transmit and receive wireless communication signals. Each transceiver may communicate with other wireless devices in distinct operating frequency bands and/or using distinct communication protocols. For example, the Wi-Fi transceiver may communicate within a 2.4 GHz frequency band and/or within a 5 GHz frequency band in accordance with the IEEE 802.11 specification. The cellular transceiver may communicate within various RF frequency bands in accordance with a 4G Long Term Evolution (LTE) protocol described by the 3rd Generation Partnership Project (3GPP) (e.g., between approximately 700 MHz and approximately 3.9 GHz) and/or in accordance with other cellular protocols (e.g., a Global System for Mobile (GSM) communications protocol). In other embodiments, the transceivers included within the stations STA1-STA4 and/or AP 110 may be any technically feasible transceiver such as a ZigBee transceiver described by a specification from the ZigBee specification, a WiGig transceiver, and/or a HomePlug transceiver described a specification from the HomePlug Alliance.

Figure 2:
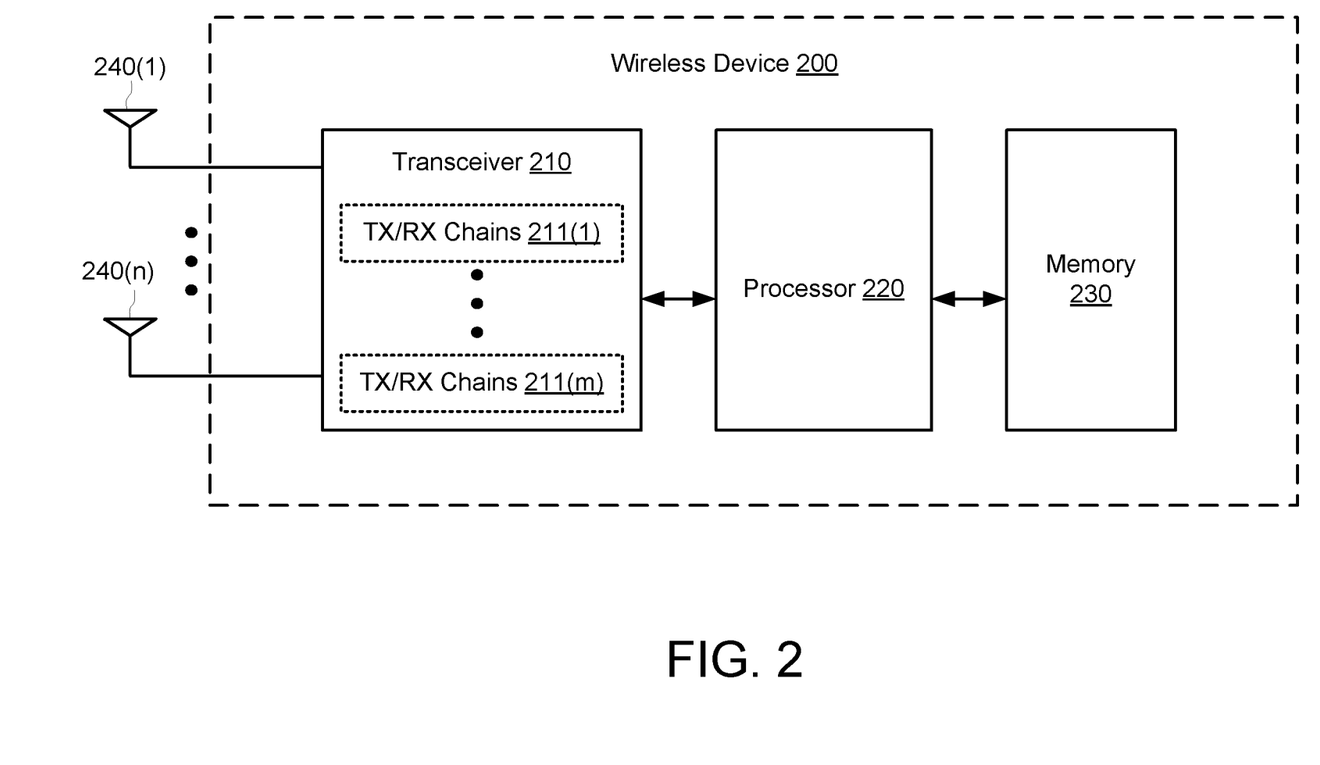
FIG. 2 shows a block diagram of a wireless device within which the example embodiments may be implemented.

FIG. 2 shows a block diagram of a wireless device 200 in accordance with example embodiments. The wireless device 200 may be one example of a STA (e.g., stations STA1-STA4 of FIG. 1) or an AP (e.g., AP 110 of FIG. 1). The wireless device 200 is shown to include a transceiver 210, a processor 220, a memory 230, and a number of antennas 240(1)-240(n). The transceiver 210 may be used to communicate with other wireless devices or a WLAN server (not shown for simplicity) associated with WLAN 120 of FIG. 1 either directly or via one or more intervening networks. Transceiver 210 is shown to include a number of transceiver (TX/RX) chains 211(1)-211(m). Although not shown for simplicity, each of the transceiver chains 211(1)-211(m) may include a transmit chain to process and transmit signals to other wireless devices via antennas 240(1)-240(n), and may include a receive chain to process signals received from antennas 240(1)-240(n). Thus, for example embodiments, the wireless device 200 may be configured for MIMO operations. The MIMO operations may include single-user MIMO (SU-MIMO) operations and multi-user MIMO (MU-MIMO) operations. Although not shown in FIG. 2 for simplicity, transceiver chains 211(1)-211(m) may be selectively coupled to antennas 240(1)-240(n) by a suitable antenna selection circuit.

The processor 220, which is coupled to transceiver 210 and to memory 230, may be any suitable one or more processors capable of executing scripts or instructions of one or more software programs stored in wireless device 200 (e.g., within memory 230). The processor 220 may manage radio functions for wireless device 200 (e.g., to generate signals to be transmitted from wireless device 200 and/or to process signals received by wireless device 200).

Memory 230 may include a non-transitory computer-readable storage medium (e.g., one or more nonvolatile memory elements, such as EPROM, EEPROM, Flash memory, a hard drive, etc.) that may store instructions to be executed by the processor 220.

Figure 3:
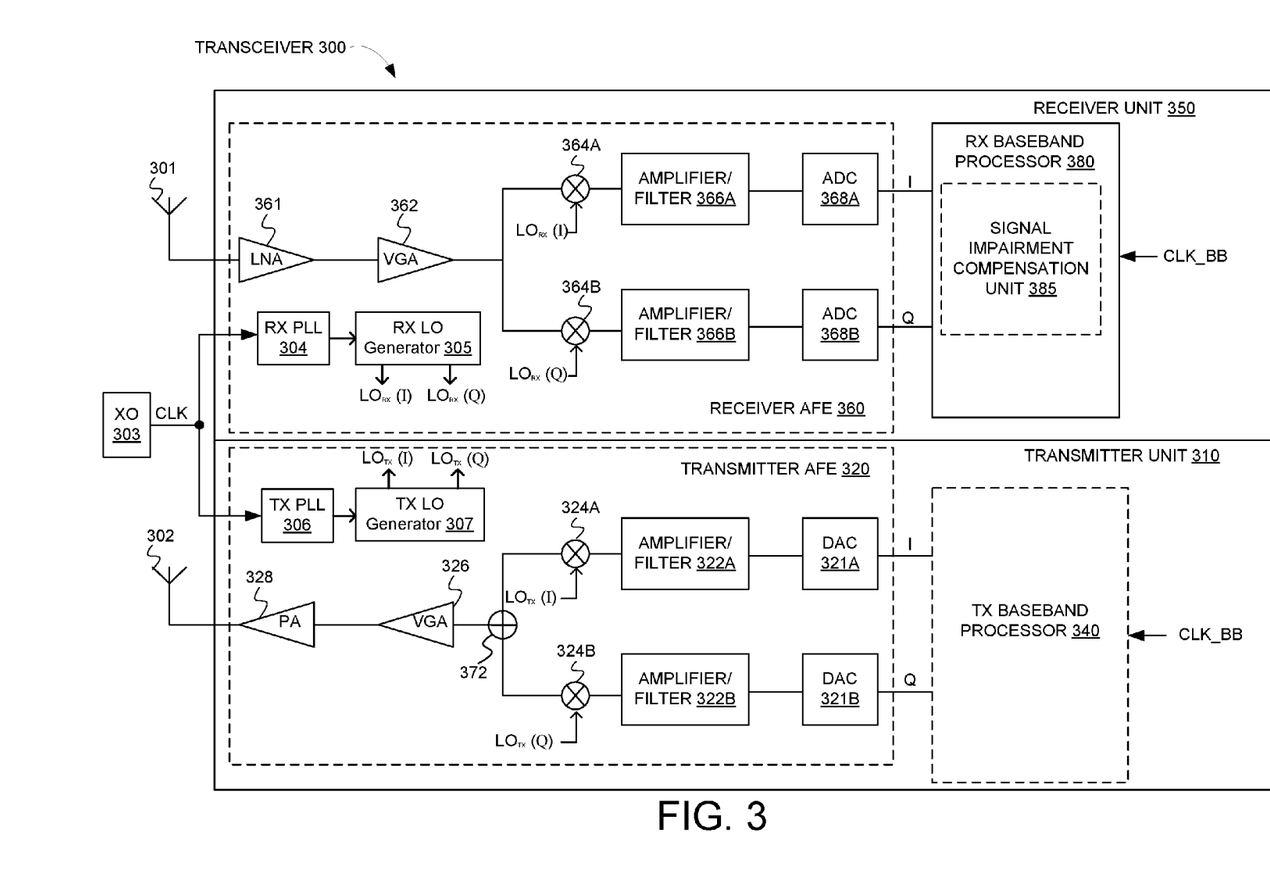
FIG. 3 shows a block diagram of an example wireless transceiver, in accordance with example embodiments.

FIG. 3 is a block diagram of an example transceiver 300 that may be one embodiment of transceiver 210 of FIG. 2. Transceiver 300, which is shown in FIG. 3 as including a transmitter unit 310 and a receiver unit 350, may utilize quadrature amplitude modulation (QAM) schemes for exchanging data (e.g., symbols) with other wireless devices. Thus, for the example depicted in FIG. 3, the transmitter unit 310 may include an in-phase (I) signal path to process in-phase signals, and may include a quadrature (Q) signal path to process quadrature signals. Similarly, the receiver unit 350 may include an in-phase (I) signal path to process in-phase signals, and may include a quadrature (Q) signal path to process quadrature signals. Further, although shown in FIG. 3 as including a single-chain transmitter unit 310 and a single-chain receiver unit 350, the transceiver 300 may include any number (e.g., a multitude) of transmit chains and receive chains, for example, to provide MIMO capabilities, dual-band operation, channel diversity, and so on.

The transceiver 300 may include or otherwise be associated with a crystal oscillator circuit 303. Although the example of FIG. 3 depicts the crystal oscillator circuit 303 as external to transmitter unit 310 and receiver unit 350, for other implementations, the crystal oscillator circuit 303 may be provided within transmitter unit 310 and/or receiver unit 350. Crystal oscillator circuit 303 may generate a reference clock signal (CLK), which in turn may be provided to transmitter unit 310 and receiver unit 350. The transmitter unit 310 and receiver unit 350 may use the reference clock signal CLK for any suitable purposes including, for example, generating clock and/or other timing signals, generating local oscillator signals, and generating carrier signals.

For the example of FIG. 3, the reference clock signal CLK may be provided to a receiver phase locked-loop (RX PLL) circuit 304 provided within receiver unit 350. The RX PLL circuit 304, which may be any suitable PLL circuit (or delay locked-loop circuit), may provide the phase-locked reference clock signal CLK to an RX local oscillator (LO) generator 305. The RX LO generator 305 may generate one or more local oscillator signals for use in receiver unit 350. For the example of FIG. 3, RX LO generator 305 may generate an in-phase LO signal $LO_{RX}$ (I) and a quadrature LO signal $LO_{RX}$ (Q). The LO signal $LO_{RX}$ (I) may be provided to mixer 364A in receiver unit 350, and the LO signal $LO_{RX}$ (Q) may be provided to mixer 364B in receiver unit 350.

The reference clock signal CLK may also be provided to a transmitter phase locked-loop (TX PLL) circuit 306 provided within transmitter unit 310. The TX PLL circuit 306, which may be any suitable PLL circuit (or delay locked-loop circuit), may provide a phase-locked reference clock signal CLK to a TX local oscillator (LO) generator 307. The TX LO generator 307 may generate one or more local oscillator signals for use in transmitter unit 310. For the example of FIG. 3, TX LO generator 307 may generate an in-phase LO signal $LO_{TX}$ (I) and a quadrature LO signal $LO_{TX}$ (Q). The LO signal $LO_{TX}$ (I) may be provided to mixer 324A in transmitter unit 310, and the LO signal $LO_{TX}$ (Q) may be provided to mixer 324B in transmitter unit 310.

The transmitter unit 310 may include one or more antennas 302, a transmitter analog front end (AFE) 320, and a transmitter baseband processor 340. In the example of FIG. 3, the transmitter AFE 320 includes a digital-to-analog converter (DAC) 321A for the in-phase (I) signal path, amplifier/filter 322A for the I signal path, a local oscillator (LO) mixer 324A for the I signal path, a DAC 321B for the quadrature (Q) signal path, amplifier/filter 322B for the Q signal path, an LO mixer 324B for the Q signal path, a combiner 372, a variable gain amplifier (VGA) 326, and a power amplifier (PA) 328. The mixers 324A and 324B may up-convert the I and Q signals from baseband directly to the carrier frequency by mixing the I and Q signals with local oscillator signals $LO_{TX}$(I) and $LO_{TX}$(Q), respectively, where the frequency of the local oscillator signals $LO_{TX}$(I) and $LO_{TX}$(Q) may be the carrier frequency. The combiner 372 may combine the up-converted I and Q signals into a transmit signal that may be amplified by VGA 326 and PA 328 before wireless transmission from antenna 302 (e.g., at the carrier frequency for a channel selected for transmission).

The receiver unit 350 may include one or more antennas 301, a receiver AFE 360, and a receiver baseband processor 380. The receiver AFE 360 includes a low-noise amplifier (LNA) 361, a VGA 362, an LO mixer 364A for the I signal path, amplifier/filter 366A for the I signal path, an analog-to-digital converter (ADC) 368A for the I signal path, an LO mixer 364B for the Q signal path, amplifier/filter 366B for the Q signal path, and an ADC 368B for the Q signal path. The mixers 364A and 364B may directly down-convert the received signal into baseband I and Q signals by mixing the received signal with local oscillator signals $LO_{RX}$ (I) and $LO_{RX}$ (Q), respectively, where the frequency of the local oscillator signals $LO_{RX}$ (I) and $LO_{RX}$ (Q) is ideally the carrier frequency.

Mismatch between mixers 364A and 364B, between amplifiers/filters 366A and 366B, and/or between ADCs 368A and 368B may result in receiver-side I/Q mismatch. Similarly, mismatch between mixers 324A and 324B, between amplifiers/filters 322A and 322B, and/or between DACs 321A and 321B may result in receiver-side I/Q mismatch. A difference between the frequency of the local oscillator signals in the receiver unit 350 and the corresponding frequency of local oscillator signals in the transmitter unit 310 may result in carrier frequency offset. Further, a difference between the phase and/or frequency of the local oscillator signals in the receiver unit 350 and the corresponding phase and/or frequency of local oscillator signals in the transmitter unit 310 may result in carrier phase offset. For the example of FIG. 3, the receiver baseband processor 380 may include a signal impairment compensation unit 385 for estimating and compensating for the above-described signal impairments and I/O mismatch in both in the transmitter unit 310 and the receiver unit 350.

The components described with reference to FIG. 3 are exemplary only. In various embodiments, one or more of the components described may be omitted, combined, or modified, and additional components may be included. For example, the transmitter unit 310 and receiver unit 350 may share one or more common antennas, and/or may have various additional antennas and transmitter/receiver chains. In some implementations, the transceiver 300 may include less or more filters and/or amplifiers.

Figure 4:
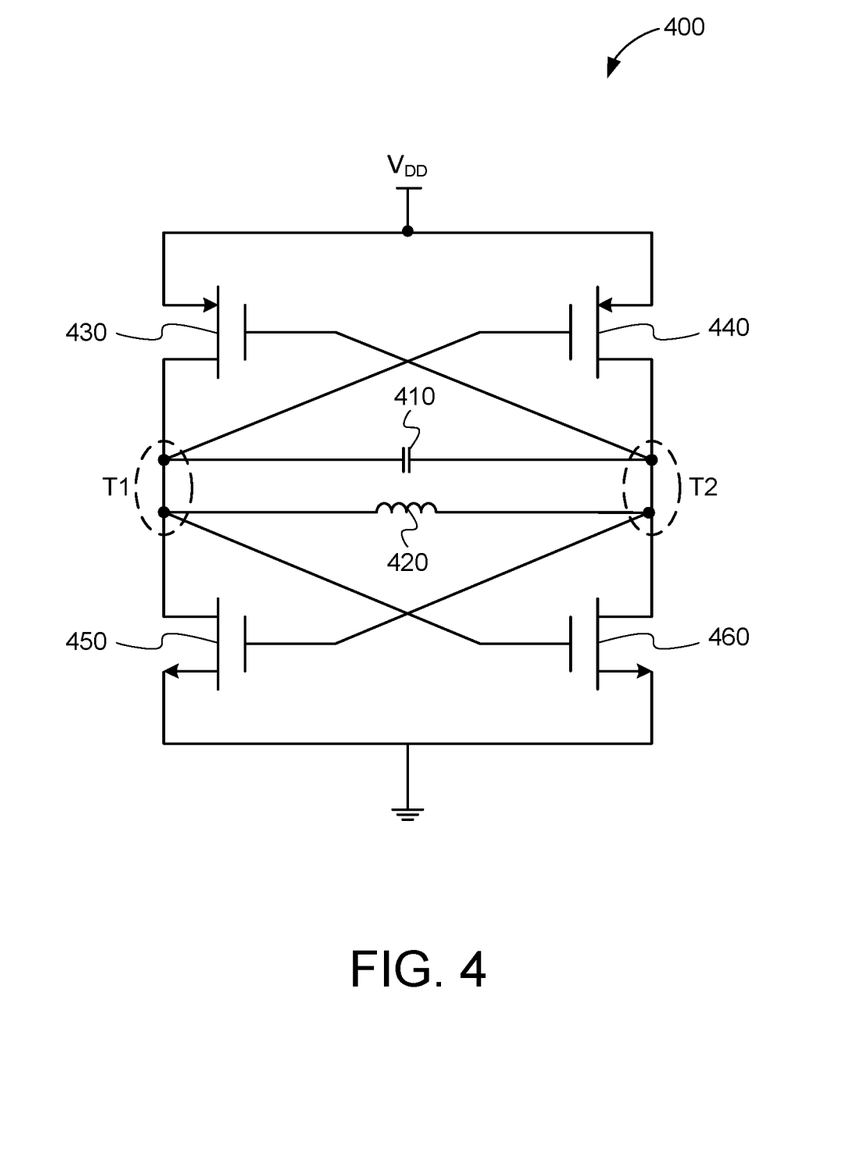
FIG. 4 shows a differential LC oscillator circuit.

As mentioned above, differential oscillator circuits may be more immune to interference and frequency spurs than single-ended oscillator circuits. Some differential oscillator circuits may include an inductor-capacitor (LC) tank circuit to generate an oscillating signal. For example, FIG. 4 shows a circuit diagram for an example differential LC oscillator circuit 400. As shown in FIG. 4, the differential LC oscillator circuit 400 may include a capacitor 410, an inductor 420, a first pair of cross-coupled transistors 430 and 440, and a second pair of cross-coupled transistors 450 and 460. The capacitor 410 and inductor 420 may form an LC tank circuit having a first terminal (T1) and a second terminal (T2). Transistor 430 is coupled between a supply voltage $V_{DD}$ and the first terminal, and includes a gate coupled to the second terminal. Transistor 440 is coupled between $V_{DD}$ and the second terminal, and includes a gate coupled to the first terminal. Transistor 450 is coupled between the first terminal and ground, and includes a gate coupled to the second terminal. Transistor 460 is coupled between the second terminal and ground, and includes a gate coupled to the first terminal.

As mentioned above, differential oscillator circuits may latch up at relatively low frequencies (e.g., rather than oscillating) due to the lack of a low-impedance DC path. The differential LC oscillator circuit 400 depicted in FIG. 4 lacks a low-impedance DC path, and may therefore be susceptible to latching at relatively low frequencies.

Figure 5:
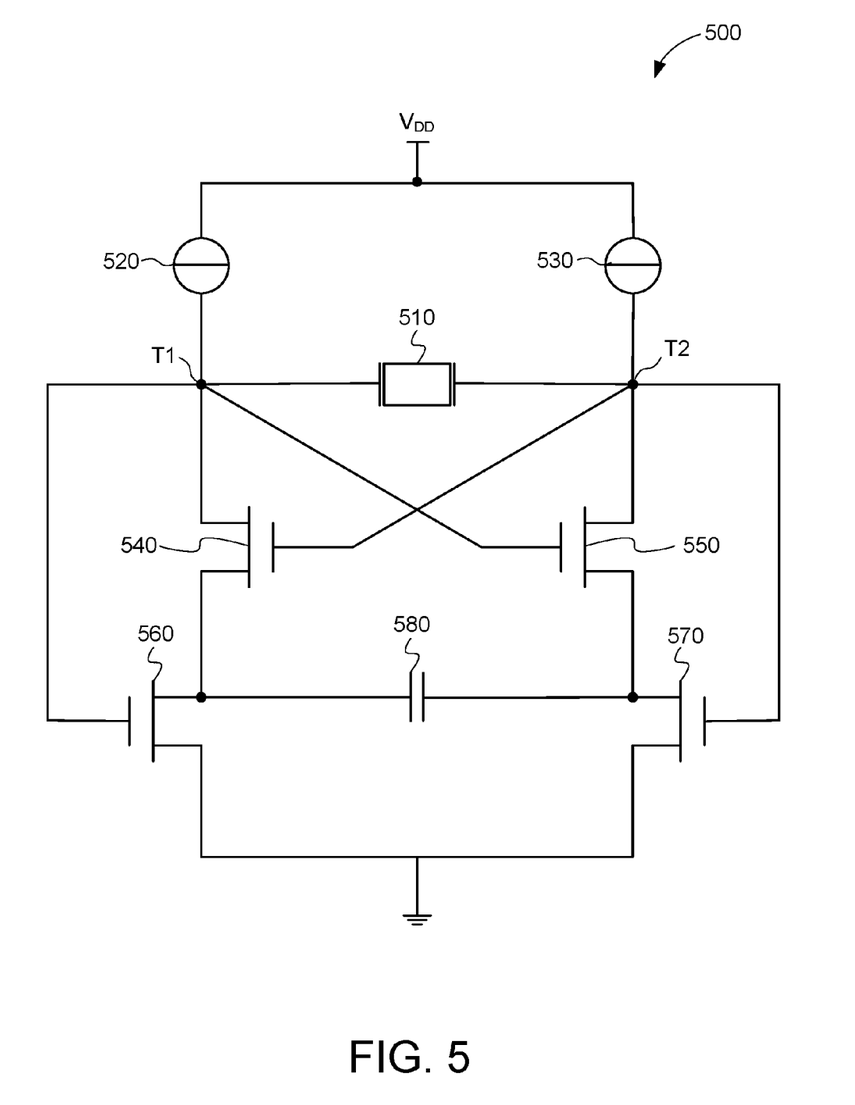
FIG. 5 shows a differential crystal oscillator circuit employing source degeneration.

One solution to prevent latching at relatively low frequencies is to employ high-pass filtering or source degeneration techniques within a differential oscillator circuit. For example, FIG. 5 shows a differential crystal oscillator circuit 500 that employs current source degeneration with AC coupling. The differential crystal oscillator circuit 500 is shown to include a crystal oscillator 510, a first current source 520 coupled between $V_{DD}$ and a first terminal (T1) of crystal oscillator 510, a second current source 530 coupled between $V_{DD}$ and a second terminal (T2) of crystal oscillator 510, a pair of cross-coupled transistors 540 and 550, a pair of source degeneration transistors 560 and 570, and a capacitor 580. The current sources 520 and 530 may regulate the amplitude of the oscillation signal generated by crystal oscillator 510. Capacitor 580, which is coupled between respective source terminals of cross-coupled transistors 540 and 550, may determine a frequency above which the crystal oscillator 510 may oscillate (and below which DC stabilization may cause undesirable latching). Source degeneration transistor 560 is coupled between transistor 540 and ground potential, and includes a gate coupled to the first terminal T1. Source degeneration transistor 570 is coupled between transistor 550 and ground potential, and includes a gate coupled to the second terminal T2. Together, source degeneration transistors 560 and 570 may prevent differential crystal oscillator circuit 500 from latching at relatively low frequencies. However, the source degeneration transistors 560 and 570 may result in increased phase noise (e.g., as compared with the differential LC oscillator circuit 400 of FIG. 4).

Figure 6:
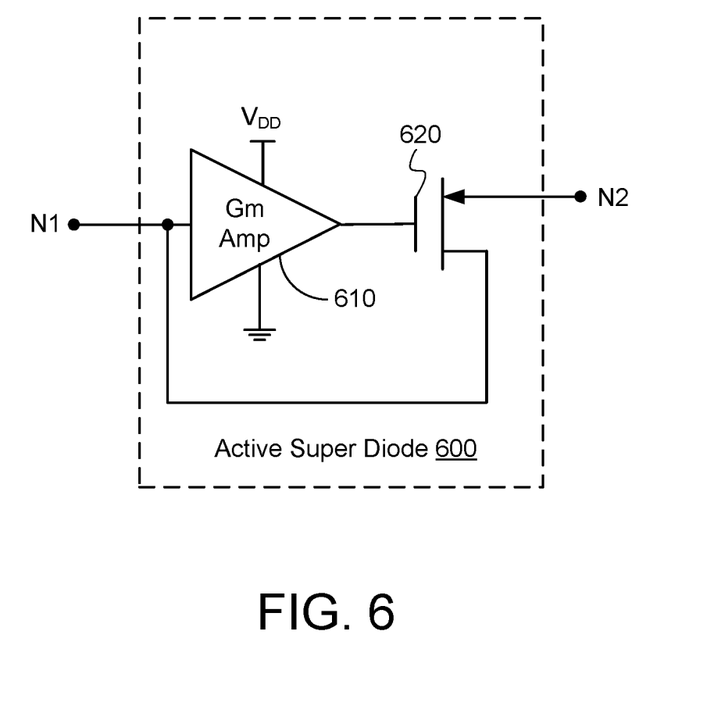
FIG. 6 shows a circuit diagram of a super diode in accordance with example embodiments.

In accordance with the example embodiments, a differential crystal oscillator circuit may include one or more active super diodes that may prevent latching at relatively low frequencies by providing a low-impedance DC path. For example, FIG. 6 shows a circuit diagram of an active super diode 600 in accordance with example embodiments. The active super diode 600 may include a first node N1, a second node N2, a transconductance (Gm) amplifier 610, and a diode-connected transistor 620. The Gm amplifier 610 includes an input terminal coupled to node N1, an output terminal coupled to a gate of the diode-connected transistor 620, a first power terminal coupled to $V_{DD}$, and a second power terminal coupled to ground potential. The diode-connected transistor 620 includes a source coupled to the second node N2, and a drain coupled to the input terminal of the Gm amplifier 610. For example embodiments discussed herein, the diode-connected transistor 620 may be a PMOS transistor. For other implementations, the diode-connected transistor 620 may be an NMOS transistor, a field-effect transistor (FET), a CMOS transistor, or any other suitable transistor.

As depicted in FIG. 6, the Gm amplifier 610 is coupled between the drain and gate terminals of the diode-connected transistor 620, and is thus effectively integrated within the diode-connected transistor 620. As a result, the Gm amplifier 610 may increase the transconductance of the diode-connected transistor 620 (e.g., as compared with a diode-connected transistor that does not include a Gm amplifier coupled between its drain and gate terminals).

For the example embodiments, the Gm amplifier 610 may be configured to have a bandwidth limited to a range of relatively low frequencies, (as compared with a range of desired oscillation frequencies). More specifically, for the range of relatively low frequencies associated with the Gm amplifier 610's bandwidth, the Gm amplifier 610 may have a positive gain that causes the Gm amplifier 610 to amplify the voltage at node N1. In this manner, the Gm amplifier 610 may amplify the voltage at the drain of diode-connected transistor 620, and then provide the resulting amplified voltage to the gate of diode-connected transistor 620. The resulting amplified voltage may turn on diode-connected transistor 620, thereby minimizing its series resistance at relatively low frequencies. As a result, active super diode 600 may exhibit a relatively small impedance (e.g., a relatively high positive transconductance) for relatively low frequencies, which in turn may prevent an associated differential crystal oscillator circuit from latching at relatively low frequencies.

For frequencies outside the bandwidth of Gm amplifier 610 (e.g., for the desired oscillation frequency or frequencies), the Gm amplifier's gain may decrease to a level that causes the diode-connected transistor 620 to turn off, thereby increasing the series resistance of the diode-connected transistor 620. As a result, active super diode 600 may exhibit a relatively high impedance (e.g., a negligible positive transconductance) for the desired oscillation frequency, which in turn may allow the associated differential crystal oscillator circuit to provide a stable and continuous oscillating signal.

As explained in more detail below with respect to FIG. 7A, the example embodiments may employ a number of active super diodes 600 within a differential crystal oscillator circuit to prevent the differential crystal oscillator circuit from latching at relatively low frequencies without impairing the ability of the differential crystal oscillator circuit to generate a stable and continuous oscillating signal at a desired oscillation frequency.

Figure 7A:
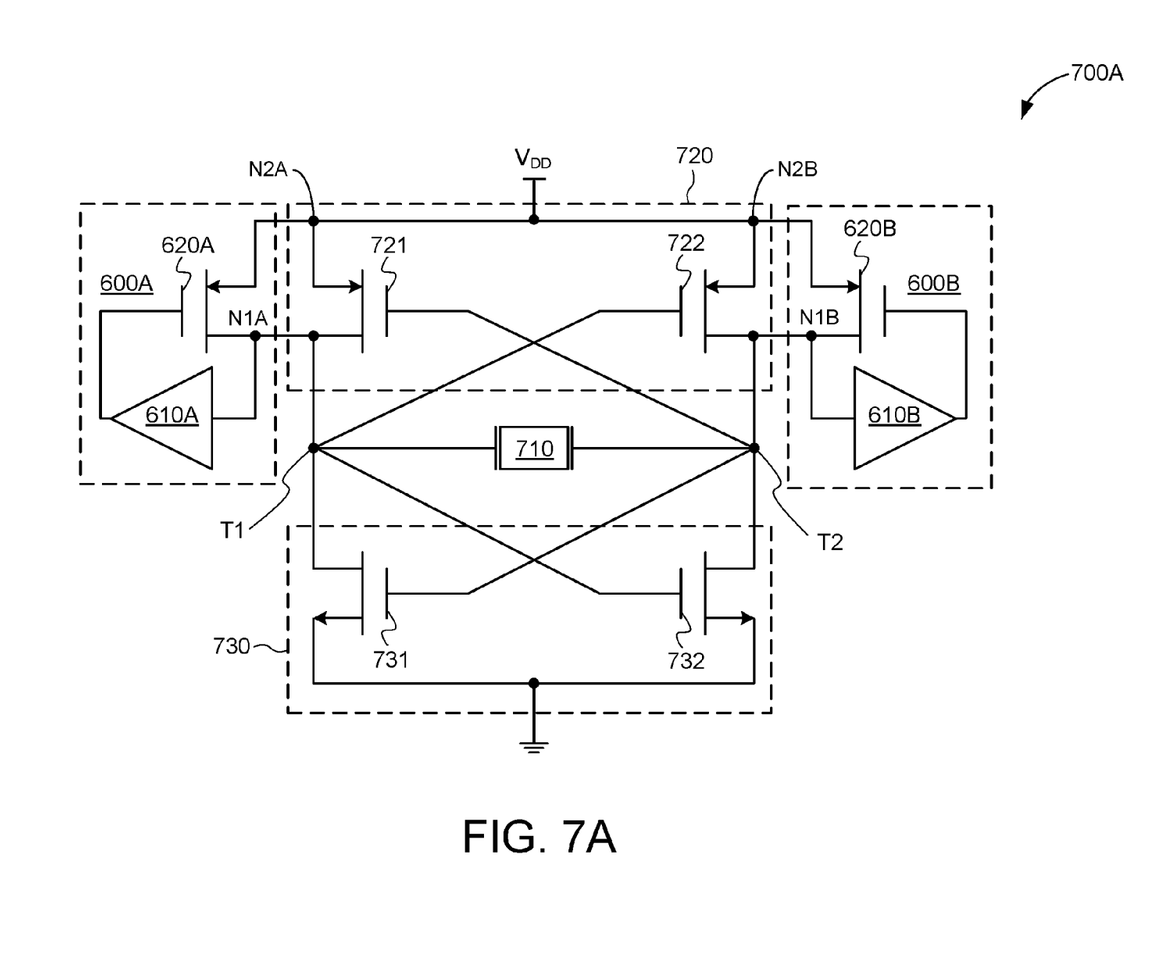
FIG. 7A shows a circuit diagram of a differential crystal oscillator circuit in accordance with some embodiments.

FIG. 7A shows an example differential crystal oscillator circuit 700A in accordance with some embodiments. The differential crystal oscillator circuit 700A is shown to include a crystal 710, a first circuit 720 formed by a first pair of cross-coupled transistors 721 and 722, a second circuit 730 formed by a second pair of cross-coupled transistors 731 and 732, a first active super diode 600A, and a second active super diode 600B. The first active super diode 600A may include a first Gm amplifier 610A and a first diode-connected transistor 620A. The second active super diode 600B may include a second Gm amplifier 610B and a second diode-connected transistor 620B. For purposes of discussion herein, the first and second active super diodes 600A and 600B may be embodiments of the active super diode 600 of FIG. 6.

The crystal 710, which may be any suitable type of crystal that generates an oscillating signal (e.g., a quartz crystal), is coupled between a first terminal (T1) and a second terminal (T2) of the differential crystal oscillator circuit 700A. The crystal 710 may generate an oscillating signal in a well-known manner. The oscillating signal may be amplified and/or stabilized by the first circuit 720, the second circuit 730, and/or the active super diodes 600A and 600B. For other embodiments, other suitable oscillating devices or structures may be used for crystal 710.

Transistor 721 may have a source coupled to a supply voltage $V_{DD}$, a gate coupled to the second terminal T2, and a drain coupled to the first terminal T1. Transistor 722 may have a source coupled to $V_{DD}$, a gate coupled to the first terminal T1, and a drain coupled to the second terminal T2. The first circuit 720 formed by cross-coupled transistors 721 and 722 may provide a negative impedance (e.g., between crystal 710 and $V_{DD}$) that allows the crystal 710 to oscillate at a desired oscillation frequency.

Transistor 731 may have a drain coupled to the first terminal T1, a gate coupled to the second terminal T2, and a source coupled to ground potential. Transistor 732 may have a drain coupled to the second terminal T2, a gate coupled to the first terminal T1, and a source coupled to ground potential. The second circuit 730 formed by cross-coupled transistors 731 and 732 may also provide a negative impedance (e.g., between crystal 710 and ground potential) that allows the crystal 710 to oscillate at the desired oscillation frequency.

The first active super diode 600A may be coupled between the first terminal T1 and $V_{DD}$. The second active super diode 600B may be coupled between the second terminal T2 and $V_{DD}$. The first and second active super diodes 600A and 600B may each exhibit a relatively small impedance (e.g., a relatively high positive transconductance) at relatively low frequencies, and may each exhibit a relatively high impedance (e.g., a negligible positive transconductance) at the desired oscillation frequency.

The negative impedances provided by the first circuit 720 and the second circuit 730 may vary based, at least in part, on values of applied voltages and/or currents. Thus, for at least some implementations, the first circuit 720 and/or the second circuit 730 may be configured to provide negative impedances only over a selected range of frequencies, for example, that corresponds to the desired oscillation frequency. For example, at the desired oscillation frequency, the negative impedances provided by the first circuit 720 and the second circuit 730 may cancel a positive impedance associated with the crystal 710 (e.g., around the desired oscillation frequency), thereby creating a lossless resonator that may continuously generate an oscillating signal at the desired oscillation frequency.

At the relatively low frequencies, the relatively high positive transconductance exhibited by the first active super diode 600A may provide a low-impedance DC path between $V_{DD}$ and the first terminal T1, and the relatively high positive transconductance exhibited by the second active super diode 600B may provide a low-impedance DC path between $V_{DD}$ and the second terminal T2. The low-impedance DC paths between $V_{DD}$ and each of the first and second terminals T1 and T2 may prevent the differential crystal oscillator circuit 700A from latching at relatively low frequencies.

At the desired oscillation frequency (e.g., at relatively high frequencies), the negligible positive transconductance exhibited by the first active super diode 600A may allow the tank circuit formed by crystal 710 and the circuits 720 and 730 to maintain a negative transconductance level suitable for starting (and maintaining) oscillation. In other words, by configuring the Gm amplifiers 610A and 610B to have bandwidths limited to relatively low frequencies, the first and second active super diodes 600A and 600B may prevent latching at relatively low frequencies without degrading the ability of the differential crystal oscillator circuit 700A to generate a stable and continuous oscillating signal at the desired oscillation frequency.

Figure 7B:
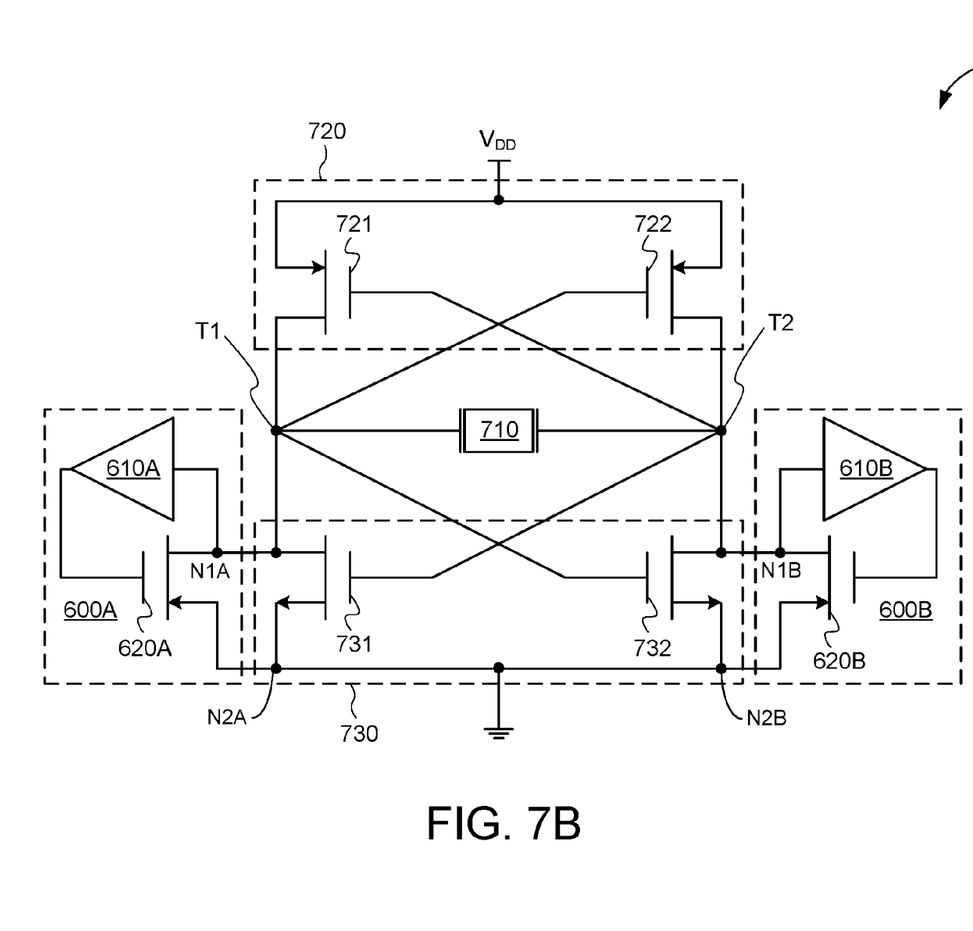
FIG. 7B shows a circuit diagram of a differential crystal oscillator circuit in accordance with other embodiments.

FIG. 7B shows a differential crystal oscillator circuit 700B in accordance with other embodiments. The differential crystal oscillator circuit 700B of FIG. 7B is similar to the differential crystal oscillator circuit 700A of FIG. 7A, except that the active super diodes 600A and 600B are coupled to the second circuit 730 (rather than to the first circuit 720). More specifically, for the example of FIG. 7B, the first active super diode 600A is coupled between the first terminal T1 and ground potential, and the second active super diode 600B is coupled between the second terminal T2 and ground potential. At the relatively low frequencies, the relatively high positive transconductance exhibited by the first active super diode 600A may provide a low-impedance DC path between the first terminal T1 and ground potential, and the relatively high positive transconductance exhibited by the second active super diode 600B may provide a low-impedance DC path between the second terminal T2 and ground potential. The low-impedance DC paths between ground potential and each of the first and second terminals T1 and T2 may prevent the differential crystal oscillator circuit 700B from latching at relatively low frequencies.

At the desired oscillation frequency (e.g., at relatively high frequencies), the negligible positive transconductance exhibited by the first active super diode 600A may allow the tank circuit formed by crystal 710 and the circuits 720 and 730 to maintain a negative transconductance level suitable for starting (and maintaining) oscillation. In other words, by configuring the Gm amplifiers 610A and 610B to have bandwidths limited to relatively low frequencies, the first and second active super diodes 600A and 600B may prevent latching at relatively low frequencies without degrading the ability of the differential crystal oscillator circuit 700B to generate a stable and continuous oscillating signal at the desired oscillation frequency.

Figure 7C:
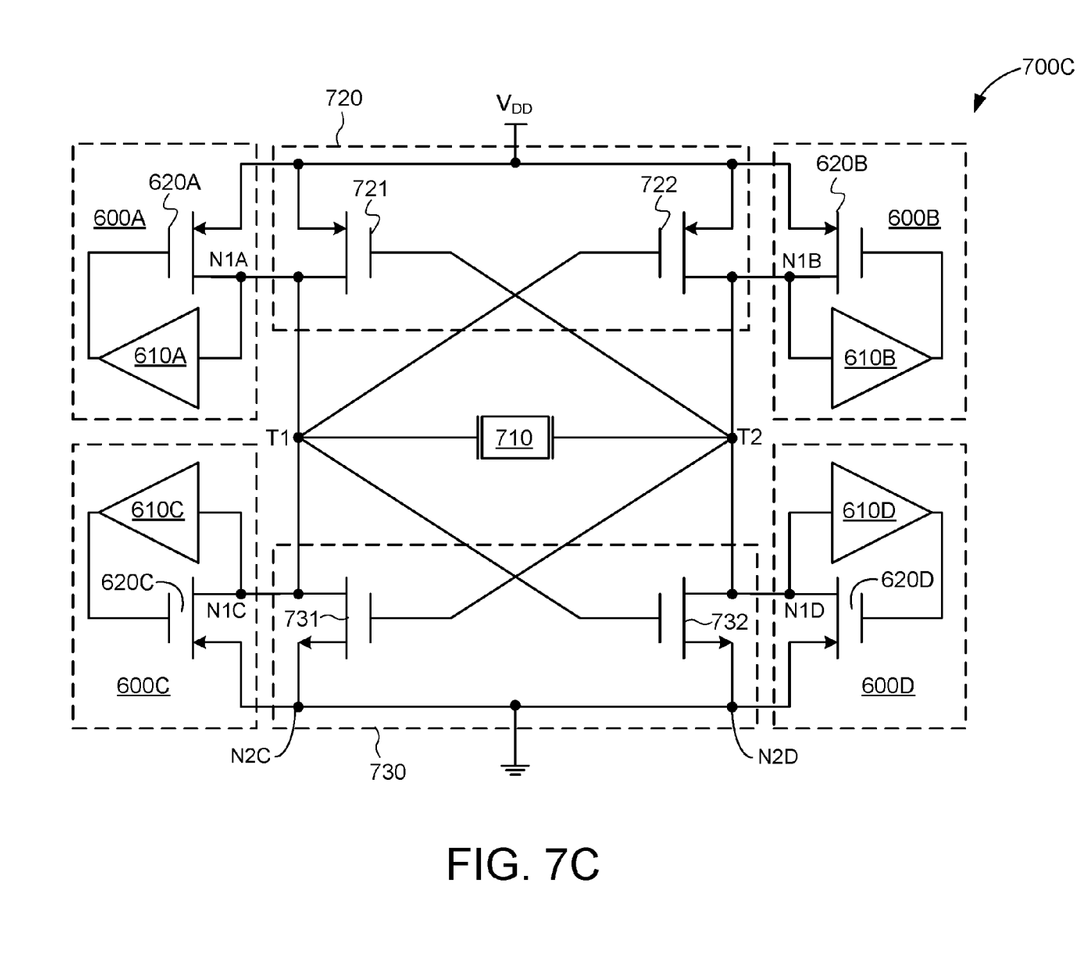
FIG. 7C shows a circuit diagram of a differential crystal oscillator circuit in accordance with other embodiments.

FIG. 7C shows a differential crystal oscillator circuit 700C in accordance with other embodiments. The differential crystal oscillator circuit 700C includes crystal 710, the first circuit 720, the second circuit 730, and four active super diodes 600A-600D. The first active super diode 600A is coupled between the first terminal T1 and $V_{DD}$, and the second active super diode 600B is coupled between the second terminal T2 and $V_{DD}$. Together, the first and second active super diodes 600A and 600B may operate in a manner similar to that described above with respect to FIG. 7A. A third active super diode 600C is coupled between the first terminal T1 and ground potential, and a fourth active super diode 600D is coupled between the second terminal T2 and ground potential. Together, the third and fourth active super diodes 600C and 600D may operate in a manner similar to that described above with respect to FIG. 7B.

As described above, the Gm amplifier 610 provided within each of the active super diodes 600 may be configured to have a limited bandwidth, for example, so that the corresponding active super diode 600 does not interfere with the negative transconductance required for the crystal 710 to oscillate at a desired oscillation frequency. It is also desirable for the Gm amplifier 610 to have enough bandwidth to ensure stability of the corresponding differential crystal oscillator circuit 700 disclosed in accordance with the example embodiments. In addition, it may be desirable to configure the Gm amplifier 610 to have poles that suppress undesired modes.

Figure 7D:
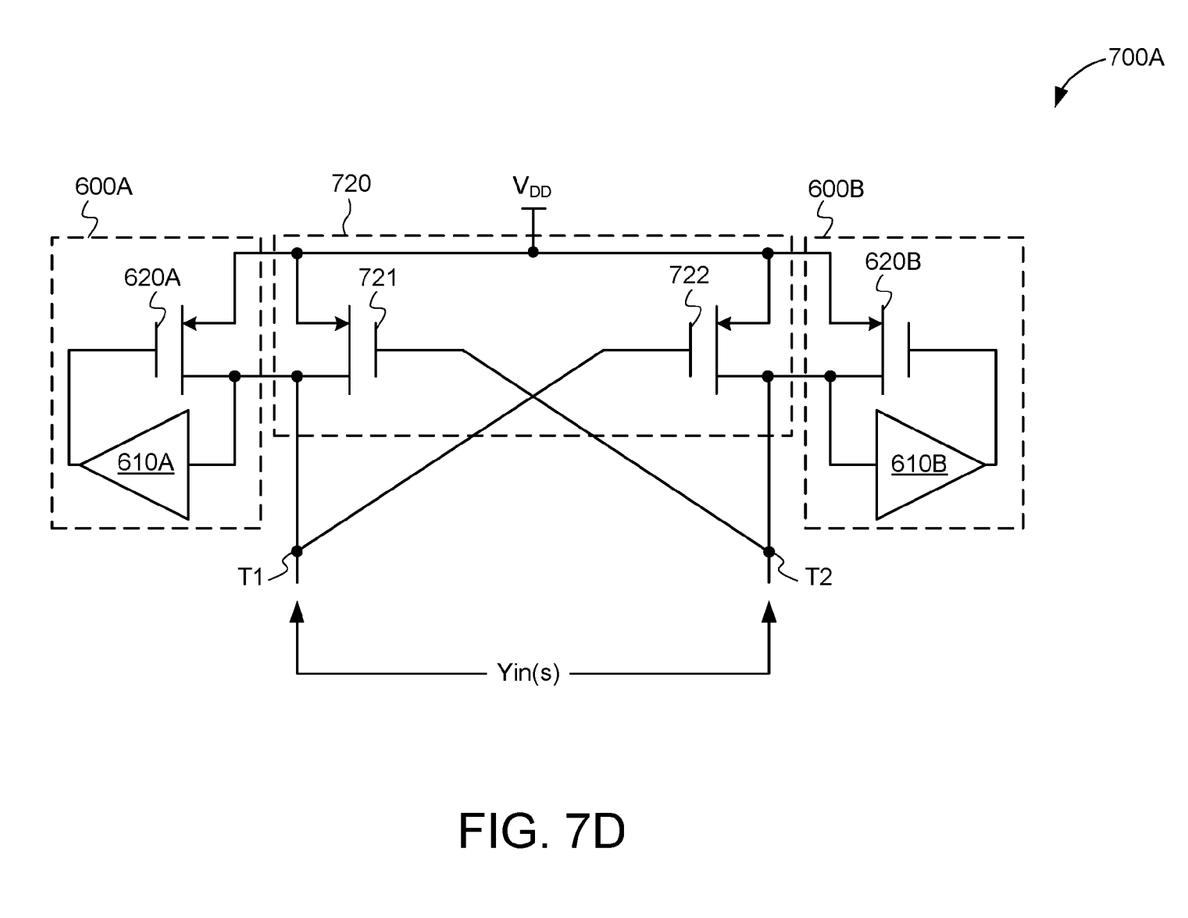
FIG. 7D shows a partial circuit diagram of the differential crystal oscillator circuit of FIG. 7A.

FIG. 7D shows a portion of differential crystal oscillator circuit 700A that may be used to determine an input admittance $Y_{in}(s)$ between the first terminal T1 and the second terminal T2 of crystal 710. The input admittance $Y_{in}(s)$ may be expressed as:

$$Y_{in}(s) = \frac{g_m A_0}{1 + s/p_1} + sC_{xo} - G_n$$

where $g_m$ is the transconductance of the Gm amplifier 610, $p_1$ is the dominant pole of the Gm amplifier 610, $G_n$ is the total negative transconductance in the tank circuit (e.g., as determined by the crystal resistance), and $C_{xo}$ is the crystal capacitance of the crystal 710.

for $\omega \ll P_1$, $Y_{in}(j\omega) \approx g_m A_0$ and for $\omega \gg P_1$, $Y_{in}(j\omega) \approx -G_n$ For stability of the crystal 710, the dominant pole $p_1$ should be $$p_1 > \frac{G_n}{C_{xo}}$$

and the Gm amplifier 600 may be configured such that dominant pole $p_1$ may be as close as practicable to this lower limit.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A differential crystal oscillator circuit, comprising:
   a crystal, coupled between a first terminal and a second terminal, to generate an oscillating signal;
   a first transistor including a drain coupled to the first terminal, a gate coupled to the second terminal, and a source coupled to a supply voltage;
   a second transistor including a drain coupled to the second terminal, a gate coupled to the first terminal, and a source coupled to the supply voltage;
   a first super diode coupled between the first terminal and the supply voltage, the first super diode including a first transconductance (Gm) amplifier coupled to a first diode-connected transistor; and
   a second super diode coupled between the second terminal and the supply voltage, the second super diode including a second Gm amplifier coupled to a second diode-connected transistor.

2. The differential crystal oscillator circuit of claim 1, the first Gm amplifier coupled between drain and gate terminals of the first diode-connected transistor, and the second Gm amplifier coupled between drain and gate terminals of the second diode-connected transistor.

3. The differential crystal oscillator circuit of claim 1, the first super diode configured to provide a direct-current (DC) path between the first terminal and the supply voltage for a range of frequencies that is less than an oscillation frequency of the oscillating signal, and the second super diode configured to provide a DC path between the second terminal and the supply voltage for the range of frequencies that is less than the oscillation frequency of the oscillating signal.

4. The differential crystal oscillator circuit of claim 1, the first super diode and the second super diode each configured to exhibit a negligible transconductance at an oscillation frequency of the oscillating signal.

5. The differential crystal oscillator circuit of claim 1, the first transistor and the second transistor forming a first circuit that is to exhibit a negative impedance at an oscillation frequency of the oscillating signal.

6. The differential crystal oscillator circuit of claim 1, the first transistor and the second transistor forming a first circuit that is to exhibit a positive transconductance for a range of frequencies that is less than an oscillation frequency of the oscillating signal.

7. The differential crystal oscillator circuit of claim 1, further comprising:
   a third transistor including a drain coupled to the first terminal, a gate coupled to the second terminal, and a source coupled to ground potential; and
   a fourth transistor including a drain coupled to the second terminal, a gate coupled to the first terminal, and a source coupled to the ground potential.

8. The differential crystal oscillator circuit of claim 7, the third transistor and the fourth transistor forming a second circuit that is to exhibit a negative impedance at an oscillation frequency of the oscillating signal.

9. The differential crystal oscillator circuit of claim 7, the third transistor and the fourth transistor forming a second circuit that is to exhibit a positive transconductance for a range of frequencies that is less than an oscillation frequency of the oscillating signal.

10. The differential crystal oscillator circuit of claim 7, further comprising:
    a third super diode coupled between the first terminal and the ground potential, the third super diode including a third Gm amplifier coupled to a third diode-connected transistor; and
    a fourth super diode coupled between the second terminal and the ground potential, the fourth super diode including a fourth Gm amplifier coupled to a fourth diode-connected transistor.

11. The differential crystal oscillator circuit of claim 10, the third Gm amplifier coupled between drain and gate terminals of the third diode-connected transistor, and the fourth Gm amplifier coupled between drain and gate terminals of the fourth diode-connected transistor.

12. A differential crystal oscillator circuit, comprising: a crystal, coupled between a first terminal and a second terminal, to generate an oscillating signal;
    a first transistor including a drain coupled to the first terminal, a gate coupled to the second terminal, and a source coupled to ground potential;
    a second transistor including a drain coupled to the second terminal, a gate coupled to the first terminal, and a source coupled to the ground potential;
    a first super diode coupled between the first terminal and the ground potential, the first super diode including a first transconductance (Gm) amplifier coupled to a first diode-connected transistor; and
    a second super diode coupled between the second terminal and the ground potential, the second super diode including a second Gm amplifier coupled to a second diode-connected transistor.

13. The differential crystal oscillator circuit of claim 12, the first Gm amplifier coupled between drain and gate terminals of the first diode-connected transistor, and the second Gm amplifier coupled between drain and gate terminals of the second diode-connected transistor.

14. The differential crystal oscillator circuit of claim 12, the first super diode configured to provide a direct-current (DC) path between the first terminal and the ground potential for a range of frequencies that is less than an oscillation frequency of the oscillating signal, and the second super diode configured to provide a DC path between the second terminal and the ground potential for the range of frequencies that is less than the oscillation frequency of the oscillating signal.

15. The differential crystal oscillator circuit of claim 12, the first super diode and the second super diode each configured to provide a negative transconductance at an oscillation frequency of the oscillating signal.

16. The differential crystal oscillator circuit of claim 12, the first transistor and the second transistor forming a first circuit that is to:
    exhibit a negative impedance at an oscillation frequency of the oscillating signal; and
    exhibit a positive transconductance for a range of frequencies that is less than ah the oscillation frequency.

17. A circuit to provide a clock signal, the circuit comprising:
- a crystal, coupled between a first terminal and a second terminal, to generate an oscillating signal;
- a pair of cross-coupled transistors coupled to the crystal; and
- a pair of super diodes, each coupled to a respective one of the first and second terminals, each comprising a transconductance (GM) amplifier coupled to a diode-connected transistor, and each configured to:
  - exhibit a negligible transconductance at an oscillation frequency of the oscillating signal; and
  - provide a direct-current (DC) path, between a first voltage and a respective one of the first and second terminals, for a range of frequencies that is less than the oscillation frequency of the oscillating signal.

18. The circuit of claim 17, the Gm amplifier coupled between drain and gate terminals of the diode-connected transistor.

19. The circuit of claim 17, the first voltage comprising one of a positive supply voltage and ground potential, and a second voltage comprising another of the positive supply voltage and the ground potential.

* * * * *